United States Patent
Golnas et al.

[11] Patent Number: 5,996,219
[45] Date of Patent: Dec. 7, 1999

[54] METHOD FOR EMBEDDING ELECTRIC OR OPTICAL COMPONENTS IN HIGH-TEMPERATURE METALS

[75] Inventors: Anastasios M. Golnas, Stanford; Robert Merz, Palo Alto; Fritz B. Prinz, Menlo Park, all of Calif.

[73] Assignee: The Board of Trustees of the Leland Stanford Junior University, Palo Alto, Calif.

[21] Appl. No.: 09/016,044

[22] Filed: Jan. 30, 1998

Related U.S. Application Data

[60] Provisional application No. 60/036,636, Jan. 31, 1997.

[51] Int. Cl.⁶ .................................................. H01K 43/00
[52] U.S. Cl. .................. 29/825; 174/110 R; 174/120 C; 174/120 R; 174/126.4; 219/602; 219/633; 219/76.1; 219/76.12; 427/123
[58] Field of Search .............................. 29/825, 887, 854, 29/855; 427/61, 71, 123, 126.4; 219/602, 603, 633, 76.1, 76.11, 76.12, 76.17; 174/110 R, 120 R, 120 C, 126.4

[56] References Cited

U.S. PATENT DOCUMENTS

| | | | |
|---|---|---|---|
| 3,850,023 | 11/1974 | Wainer et al. ...................... | 219/543 X |
| 4,511,600 | 4/1985 | Leas ....................................... | 427/75 X |
| 5,278,442 | 1/1994 | Prinz et al. ............................. | 257/417 |
| 5,281,789 | 1/1994 | Merz et al. ........................... | 219/76.15 |
| 5,315,154 | 5/1994 | Elwell .................................. | 257/707 X |
| 5,376,755 | 12/1994 | Negm et al. ......................... | 505/231 X |
| 5,520,715 | 5/1996 | Oeftering ............................... | 75/335 X |
| 5,520,976 | 5/1996 | Giannetti et al. .................. | 428/36.3 X |
| 5,539,254 | 7/1996 | Eytcheson et al. ................. | 257/691 X |
| 5,652,019 | 7/1997 | Moran .................................. | 427/226 X |
| 5,686,162 | 11/1997 | Polak et al. .............................. | 428/76 |
| 5,722,479 | 3/1998 | Oeftering .............................. | 164/46 X |
| 5,756,207 | 5/1998 | Clough et al. .......................... | 428/375 |

FOREIGN PATENT DOCUMENTS

| | | |
|---|---|---|
| 2-216895 | 8/1990 | Japan . |
| 4-296088 | 10/1992 | Japan . |

*Primary Examiner*—Lee Young
*Assistant Examiner*—Bian-An Nguyen
*Attorney, Agent, or Firm*—Lumen Intellectual Property Services

[57] ABSTRACT

This invention relates to a method of embedding electric components or optical components, such as sensors, in a high-temperature metal and the embedded products produced by the method. In the preferred embodiment the components are embedded on a substrate of the high-temperature metal by being placed on a first insulating layer. A second electrically insulating layer, a low thermal conductivity layer, a high thermal conductivity layer, and a primer layer are then deposited in order. The high thermal conductivity layer is in good thermal contact with the substrate. The high-temperature metal is deposited, preferably as molten drops, on the primer layer and the heat from the drops is conducted by high thermal conductivity layer to the substrate while the components are protected by the low thermal conductivity layer.

18 Claims, 6 Drawing Sheets

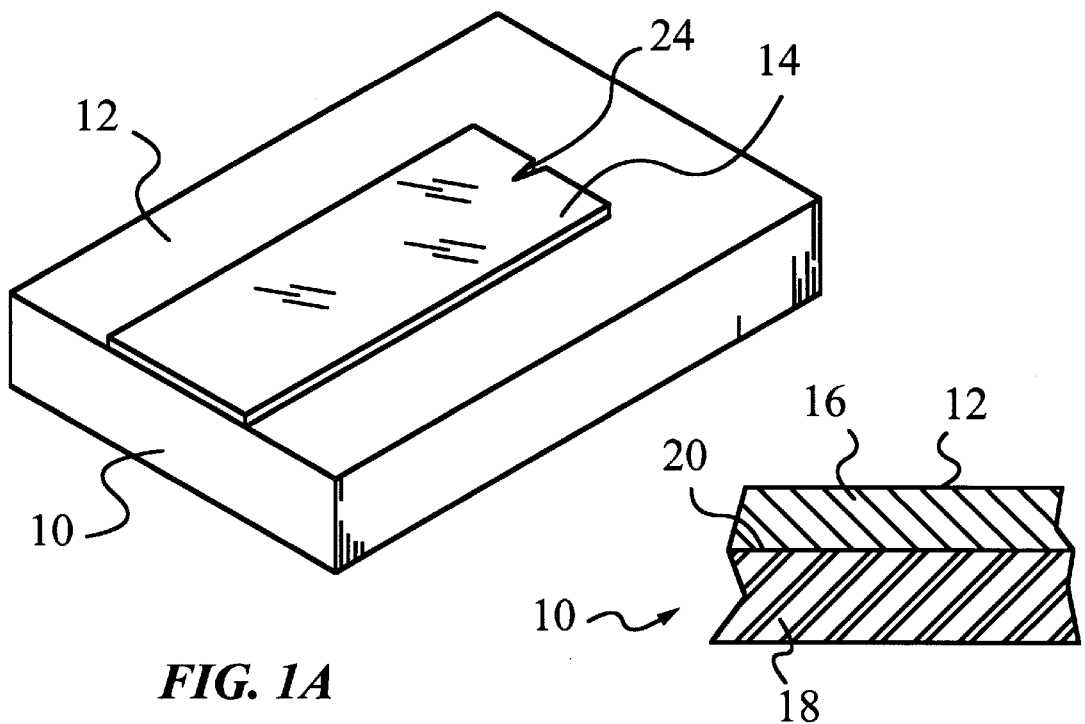
FIG. 1A
FIG. 1B
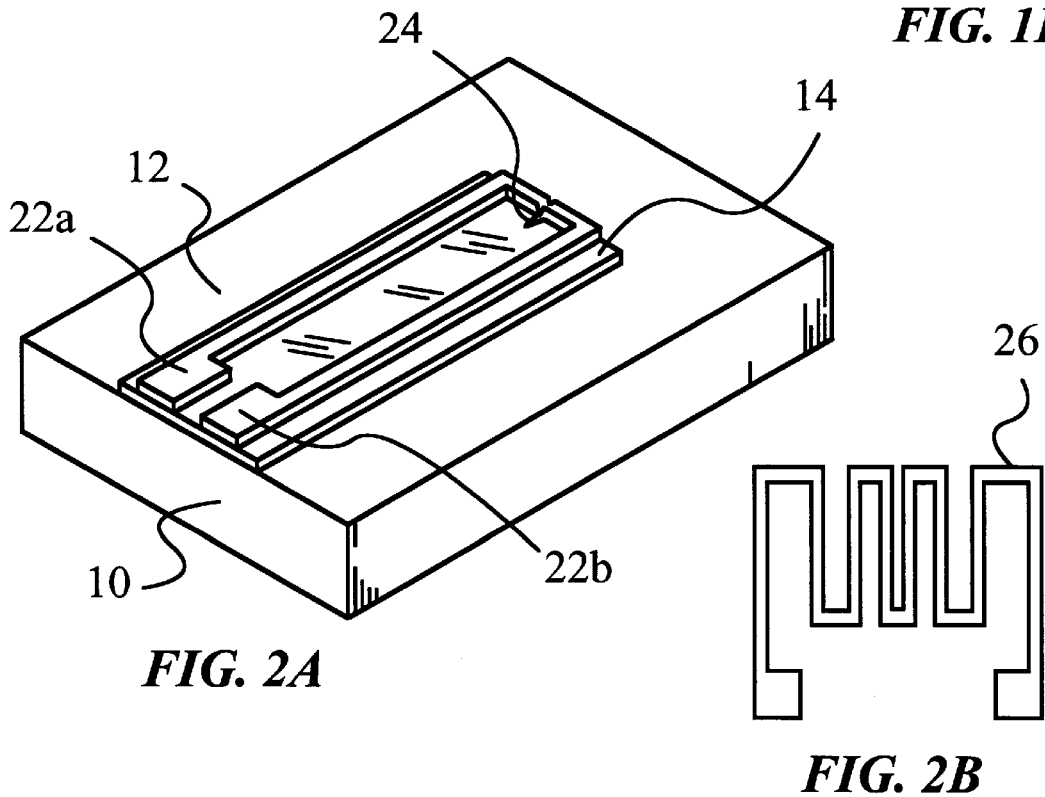
FIG. 2A
FIG. 2B

METHOD FOR EMBEDDING ELECTRIC OR OPTICAL COMPONENTS IN HIGH-TEMPERATURE METALS

RELATED APPLICATION

This patent application is based in part on provisional patent application Ser. No. 60/036,636 filed on Jan. 31, 1997.

FIELD OF THE INVENTION

This invention relates to a method for safely embedding electric and optical components such as sensors in high-temperature metals to produce embedded sensors.

BACKGROUND OF THE INVENTION

The use of electric and optical components in information gathering systems is widespread. For example, electric and optical sensors designed to provide information about environmental parameters form a subset of these devices. The most fundamental sensors are elements which react to mechanical stresses or to temperature variations. Strain gauges employ deformable mechanical structures to generate signals indicating mechanical stresses acting on them. Thermocouples use a junction of two dissimilar metals to measure temperature. Optical materials experiencing changes in optical polarization, phase or transmittance under the influence of stress or temperature variations are used in the optical counterparts of these electric devices.

Increasingly, modern applications require that sensors be deployed in hazardous surroundings. These difficult conditions may be created by corrosive or abrasive agents, wide or frequent temperature variations, large mechanical stresses, high pressures as well as any number of other unfavorable factors. The fields of manufacturing, monitoring, testing are among the many areas where such conditions exist. Clearly, sensors employed under these circumstances have to be afforded additional protection.

Prior art teaches to protect electronic components from acidic, basic or oxidizing environments with organic polymeric encapsulants. For example, in U.S. Pat. No. 5,686,162 Polak et al. teach the use of elastomeric silicones for encapsulating integrated circuits. Other references teach the use of organic-compound-containing encapsulating layers or elastomer casings for the same purpose.

These methods of encapsulating electronic components work well in many applications but become insufficient in very harsh environments. In particular, polymeric encapsulants prove insufficient in mechanically challenging conditions situations.

U.S. Pat. No. 5,278,442 to Prinz et al. describes a system of electronic/mechanical packaging prepared by incremental buildup of layers using the thermal deposition spraying technique. This process in used to layer a complementary material around electric components to provide temporary or permanent thermal and mechanical protection to the embedded circuits or components.

Unfortunately, even this system proves insufficient under very harsh working conditions. Specifically, highly resistant metals, i.e., metals having high melting temperatures, would have to play the role of the complementary material to satisfy the mechanical requirements. In addition, highly efficient thermal protection would have to be incorporated into such a package.

Thus, at the present time there is no known method for embedding electric or optical components in housings suited for deployment in harsh working conditions. This is especially a problem in the field of sensors, since these elements, more than any others, are directly exposed to the harshest conditions.

OBJECTS AND ADVANTAGES OF THE INVENTION

Accordingly, it is a primary object of the present invention to provide a method for embedding electric and optical components, especially electric and optical sensors, in mechanically and thermally robust housings.

It is another object of the invention to ensure the method is simple to carry out and that the embedded sensors can be produced in a cost-effective and efficient manner.

SUMMARY OF THE INVENTION

In the case of electric components or sensors these objects and advantages are attained by a method for embedding them in a high-temperature metal, such as steel. The first step of the method includes providing a substrate of the high-temperature metal. In the preferred embodiment the substrate has a top layer of an auxiliary material, typically an alloy such as INVAR.

During the next steps a first electrically insulating layer is deposited on the substrate, the electric components are placed on the first insulating layer and then a second electrically insulating layer is deposited on top of the components. Preferably, the auxiliary material has a first coefficient of thermal expansion, $CTE_1$ and at least one of the insulating layers has a second coefficient of thermal expansion $CTE_2$ which is approximately equal to $CTE_1$.

In most applications the electric components make up a strain gauge or a temperature sensor, e.g., a thermocouple. Of course, other elements such as piezoelectric sensors, Hall effect probes, etc. can be embedded according to the present method as well.

Next, a low thermal conductivity layer, preferably a ceramic, is deposited on the second insulating layer. Then, a high thermal conductivity layer, such as copper, is deposited on top of the low thermal conductivity layer such that the high conductivity layer is in contact with the substrate. Alternatively, an interlayer having a low coefficient of thermal expansion can replace the low thermal conductivity layer or be sandwiched between the low thermal conductivity layer and the high thermal conductivity layer. It is also possible, in some cases, to leave out the interlayer and the low thermal conductivity layers.

A structural support layer or primer layer of the high-temperature metal is deposited on the high conductivity layer. Thereafter, a cover layer of the high-temperature metal is deposited in a molten state on top of the primer layer such that the electrically insulating layers, the electric components, the low and high thermal conductivity layers are embedded between the substrate and the cover layer.

Finally, the structure with the embedded electric components is cooled. Depending on application or other use parameters, a machining step may be required after the cooling step.

The cover layer is preferably deposited in drops. In order to avoid overheating and destruction of the electric components the drops are set to fall on the primer layer at a predetermined rate. Preferably, this rate ranges from 1 drop per second to 6 drops per second. Alternatively, the cover layer is deposited by a laser deposition technique.

The method of the invention delivers electric components embedded in a block of high-temperature metal and thus capable of operating in very harsh environments. This is especially advantageous in the fields of sensing and monitoring.

Optical components are embedded by the same method with the exception that the first and second electrically insulating layers are replaced by suitable protective layers. Likewise, the optical components can make up strain gauges and temperature sensors.

The method of the invention and the resulting embedded components are described in detail in the detailed description portion with reference to the appended drawing figures.

DESCRIPTION OF THE FIGURES

FIG. 1A is an isometric view of a substrate covered with a first electrically insulating layer according to the invention.

FIG. 1B is a cross sectional view of a preferred substrate structure.

FIG. 2A is an isometric view showing the step of placing electric components (thermocouple).

FIG. 2B is a top view of an alternative electric component (stain gauge).

DETAILED DESCRIPTION

Figure 3:
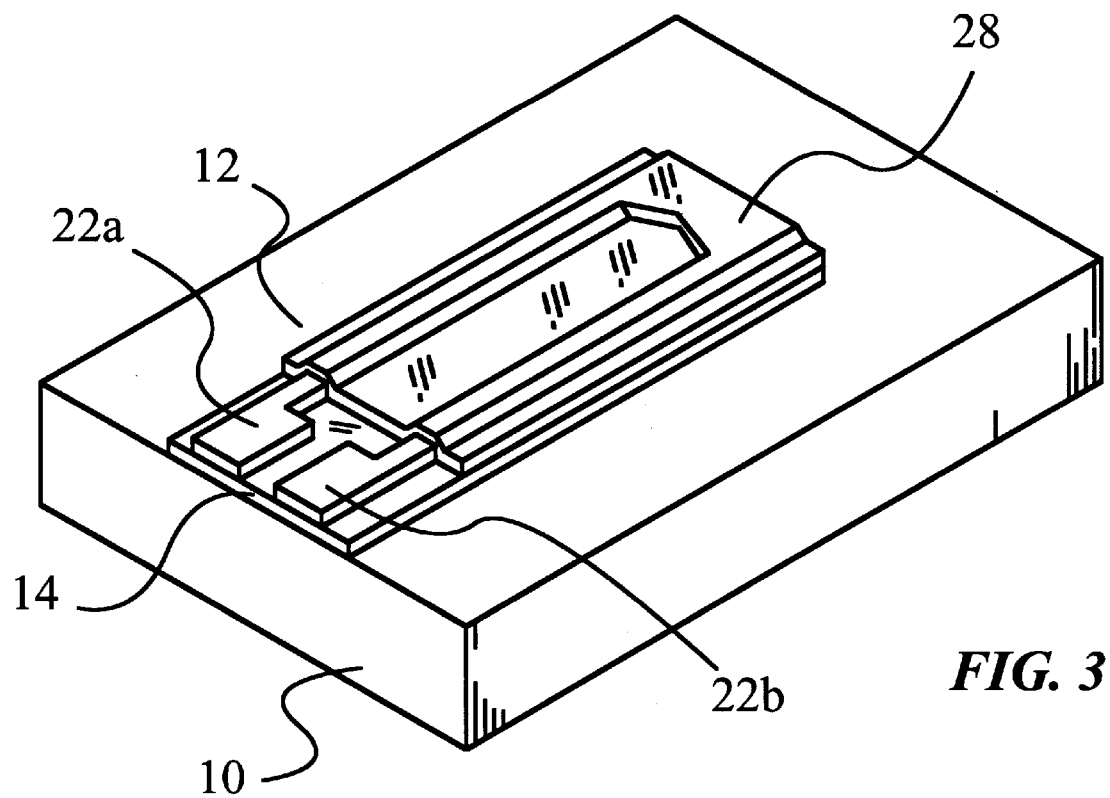
FIG. 3 is an isometric view showing the deposition of a second electrically insulating layer.

The method of the invention is classified as an incremental material buildup technique and it allows one to embed components during the fabrication process. In a preferred embodiment the method of the invention consists of several steps. During a first step, as shown in FIG. 1A, a substrate 10 is positioned with a top surface 12 facing up.

Preferably, substrate 10 is made of a high-temperature metal 18 such as steel, aluminum, titanium or the like and has a top layer 16, as shown in the cross section of FIG. 1B. Top layer 16 in this case is made of an auxiliary material such as an alloy, preferably INVAR, having a first thermal expansion coefficient $CTE_1$ ranging from about $1 \times 10^{-7}$ to over $1 \times 10^{-8}$ $K^{-1}$.

An interface 20 between metal 18 and top layer 16 can be graded or sharp. The characteristics of interface 20 vary with the chrome content, as is well-known in the art. Of course, it is also possible to do away with top layer 16.

A first electrically insulating layer 14 is deposited on top surface 12 to a thickness of approximately 2–10 $\mu$m. Insulating layer 14 is typically deposited by a physical vapor deposition (PVD) process such as sputtering, evaporation or some other suitable technique known in the art. The material of insulating layer 14 has to withstand the temperatures encountered during subsequent deposition steps. Hence, preferred candidates for insulating layer 14 are ceramic materials such as $Al_2O_3$, $SiO_2$ or $Si_3N_4$.

To keep the thickness of insulating layer 14 to a minimum top surface 12 may be polished before deposition. Furthermore, insulating layer 14 is shaped and dimensioned to only cover the area required by electric components 22 to be placed on it during the second step illustrated in FIG. 2. In the present embodiment insulating layer 14 has a rectangular shape with a notch 24 on one of its short sides. Of course, insulating layer 14 is not required if components 22 are already electrically insulated or if they do not require electric insulation.

FIG. 2 illustrates individual electric components 22a, 22b placed on top of insulating layer 14. Electric traces (conductors), sensor elements or electric components are fabricated by any of the prior art methods, e.g., PVD, photolithographic masking, lift-off and etching. For complex, multiple or interconnected components several independent processing steps with different materials may be necessary. In this embodiment components 22a and 22b are the two legs of a thermocouple. The thermocouple junction is conveniently positioned within notch 24 to remain in good thermal contact with substrate 10 and thus be able to sense external temperature. Alternatively, a strain gauge 26, as shown in FIG. 2A can also be placed on insulating layer 14. Finally, if available, prefabricated electric components can also be placed directly on insulating layer 14.

In the next step illustrated in FIG. 3, electric components 22a, 22b are covered by a second electrically insulating layer 28. The material of second insulating layer 28 is selected form the same group of materials as that of first insulating layer 14. Again, when using insulated electric components (e.g., prefabricated devices) second insulating layer 28 may be unnecessary.

Figure 4:
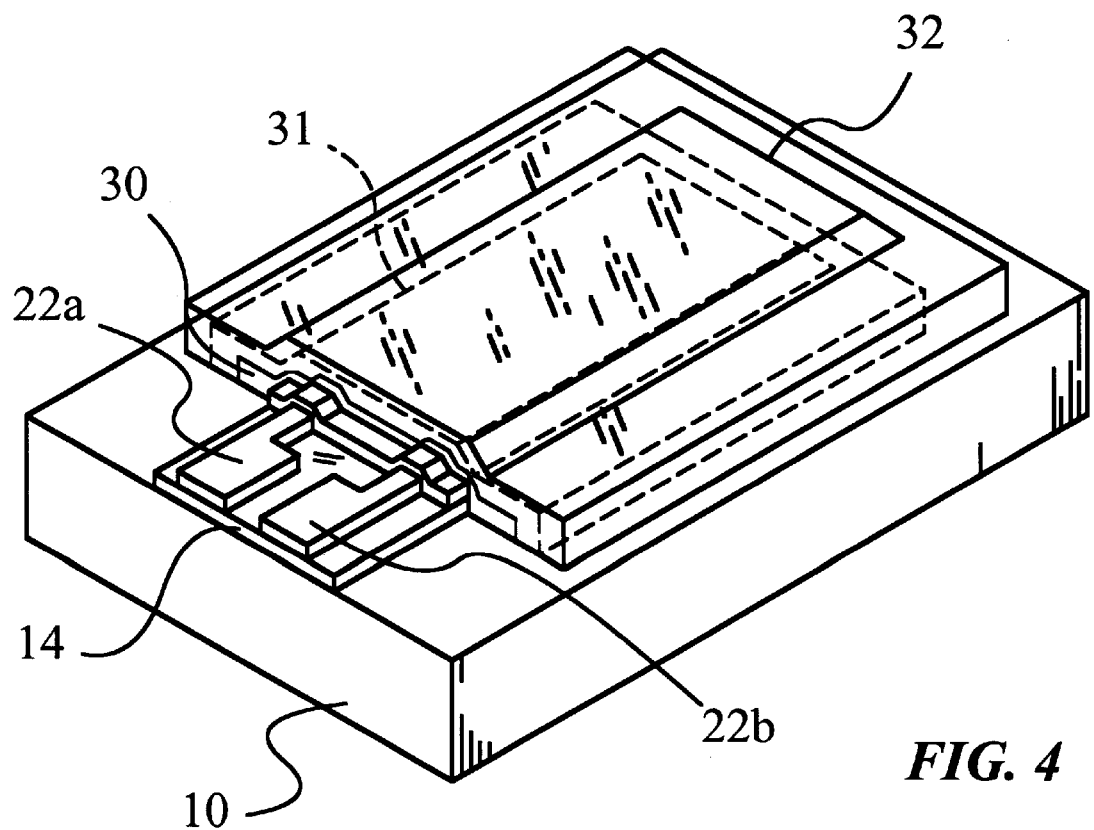
FIG. 4 is an isometric view showing the deposition of the low and high thermal conductivity layers.

During the subsequent step, as illustrated in FIG. 4, a low thermal conductivity layer 30 is deposited on top of second insulating layer 28 and a high thermal conductivity layer 32 is deposited on top of low conductivity layer 30. In some cases an interlayer 31 of a material having a low coefficient of thermal expansion, preferably INVAR, is sandwiched between low and high thermal conductivity layers 30 and 32. Low conductivity layer 30 is a ceramic or some other poor thermal conductor. It is deposited by PVD or some other suitable technique. Interlayer 31 is also deposited by PVD or another suitable technique. High conductivity layer 32 is a metal, preferably copper, and it covers low thermal conductivity layer 30 or interlayer 31, when used, completely extending beyond it to establish good thermal contact with substrate 10. In special cases, when insulating layer 28 exhibits an adequately low thermal conductivity, it may serve the same function as low thermal conductivity layer 30 and the latter may be left out.

The thermal contact between high conductivity layer 32 and substrate 10 is important in the final steps of the method. In addition, the bulk volume of high conductivity layer 32 should exceed that of low conductivity layer 30 for best results. The best way to lay down high conductivity layer 32 is to first deposit by PVD a thin coating onto low conductivity layer 30 and to then deposit the bulk of the material by electro-deposition (plating). When using the preferred deposition processes of microcasting or laser cladding in subsequent deposition steps (see below) the total thickness of layers 30 and 32 should be on the order of 1 mm. Both layers 30 and 32 can be shaped by photolithography, masking, etching or machining.

Figure 5:
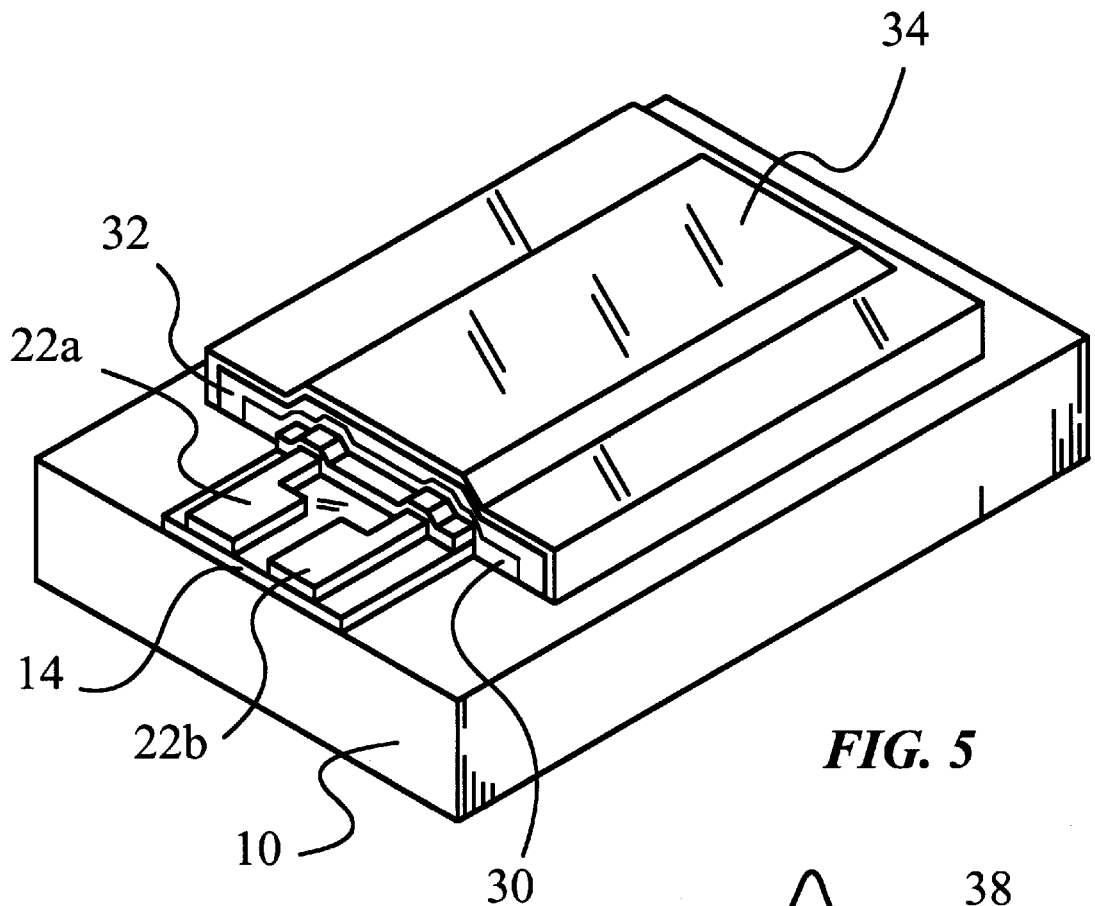
FIG. 5 is an isometric view illustrating the deposition of a primer layer.

FIG. 5 illustrates the deposition of a structural material coating or primer layer 34 necessary to ensure uniform wetting conditions for the following deposition step. Primer layer 34 is typically only high-temperature metal 18 and it is deposited by PVD or some other suitable technique. It is important, however, that primer layer 34 be deposited sufficiently thin so as not to pose a high thermal burden on the layers and components underneath it.

Figure 6:
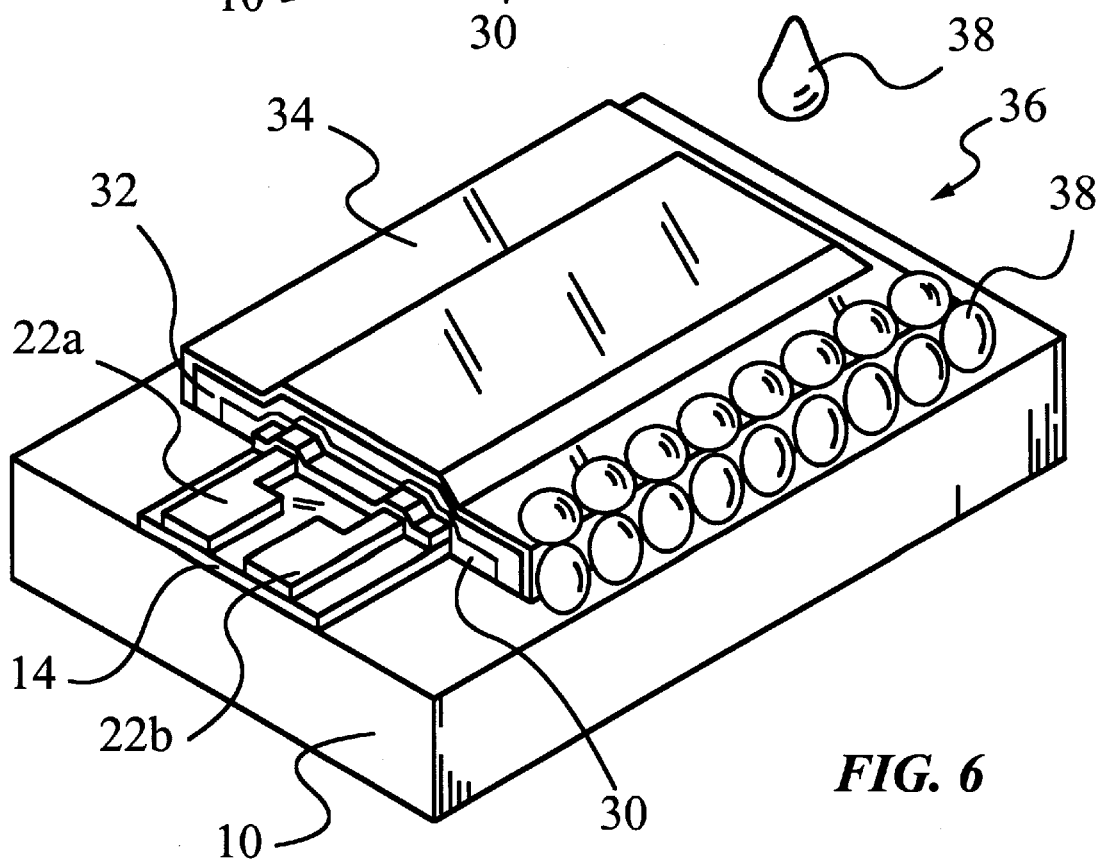
FIG. 6 is an isometric view illustrating the deposition of a high-temperature metal in the form of molten drops.

The subsequent step, shown in FIG. 6, involves depositing a cover layer 36 of metal 18 over primer layer 34. The technique used is microcasting and according to it metal 18 is deposited in the form of drops 38. A complete description of microcasting is presented in U.S. Pat. No. 5,281,789 to R. Merz et al. and R. Merz "Shape Deposition Manufacturing", Dissertation, Technical University of Vienna, Austria, 1994.

For the purposes of the present invention it is only necessary to know that to practice the microcasting method, a collector electrode and an adjacent electric welding torch (not shown) are placed over layer 34. An electric welding current is generated so that a welding current arc forms between the collector electrode and the welding torch. Metal 18 is then fed into welding current arc to produce superheated molten drops 38 (temperature for steel approximately 2,000 degrees C., diameters 2–3 mm). Drops 18 are deposited on layer 34 and substrate 10 such as to completely embed electric components 22a, 22b and all intervening layers with the exception of any electric lead terminals required for making future electric connections. To minimize the heat impact on substrate 10 and to prevent damage to electric components 22a, 22b and the other vulnerable layers drops 38 are preferably deposited at a rate of 1–2 drops per second. When drops 38 are smaller a rate of 1–6 drops per second or more may be practicable. However, extreme caution must be exercised, since excessive heat will cause the deposited layers to delaminate due to their different coefficients of thermal expansion, or even to melt outright.

During deposition of drops 38 the global temperature of substrate 10 should remain at approximately 200 degrees C. The temperature of drops 38 is adjusted, such that top layer 16 of substrate 10 remelts to a depth of several microns to achieve metallurgical bonding. For example, when using 1020 steel as metal 18 the temperature at 1.27 mm below the surface of substrate 10 directly under impacting drop 38 reaches about 400 degrees C.; sufficient for the bonding to occur.

Figure 9:
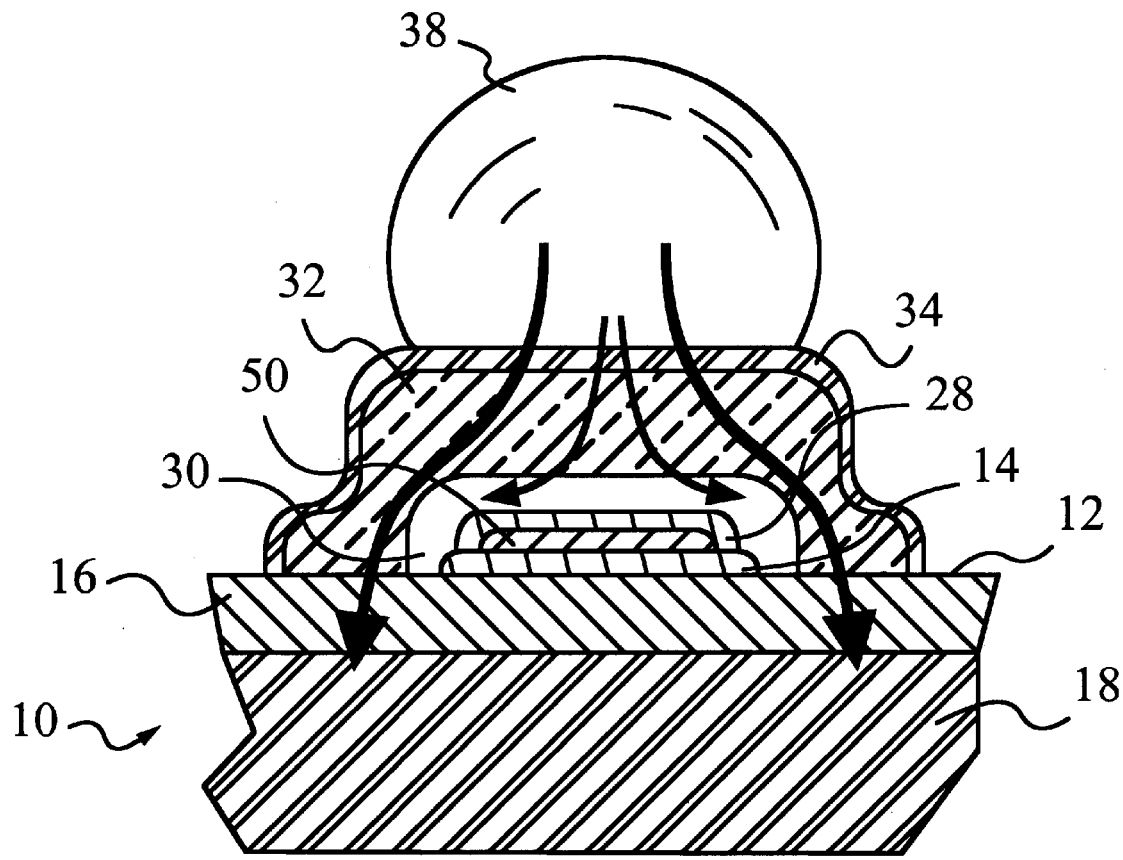
FIG. 9 is a cross sectional view showing the details of metal drop deposition.

The temperature during deposition of drops 38 is reduced even more at the site of electric components 22a, 22b by low and high thermal conductivity layers 30 and 32. The principle responsible for this temperature reduction is clarified in the cross sectional view of FIG. 9. This figure shows a different electric component 50 covered in the same manner as electric components 22a, 22b. In other words, component 50 is sandwiched between first and second insulating layers 14, 28 on top of substrate 10. The ceramic making up low thermal conductivity layer 30 encapsulates the sandwich and is in turn completely covered by layer 31, if present, and high thermal conductivity layer 32. The area of contact between substrate 10 and high thermal conductivity layer 32 is sufficiently large to ensure good heat transfer from the latter to the former. Finally, primer layer 34 sits on top of high thermal conductivity layer 32.

When drop 38 impacts and comes to rest on top of primer layer 34, the heat from it is rapidly transferred through layer 34 to the copper of layer 32. Since the copper is in good thermal contact with substrate 10, specifically top layer 16, it channels the heat from drop 38 directly to substrate 10, as indicated by the thick arrows. Meanwhile, low thermal conductivity layer 30 further aids the conduction of heat through the copper by providing a thermal barrier and thus protecting sandwiched component 50. Of course, some heat still penetrates inside layer 30 and a large portion of it is transferred to substrate 10. The thin arrows visualize the heat flow through layer 30.

In the case where insulating layer 28 exhibits sufficiently low thermal conductivity and layer 30 is left out, the thermal barrier is formed by insulating layer 28 itself. When interlayer 31 is present, it aids layer 32 in conducting the heat to substrate 10. In addition, since interlayer 10 has a low coefficient of thermal expansion, it reduces the mechanical stress on the layers below it.

Referring back to FIG. 7, the final step in the method of the invention involves cooling drops 38 to obtain the finished, embedded electric components 22a, 22b. The cooling step may involve active or passive cooling. Thereafter, the nonuniform surface of solidified drops 38 may be shaped by traditional metal machining techniques as required to produce smooth cover layer 36 as shown.

Figure 7:
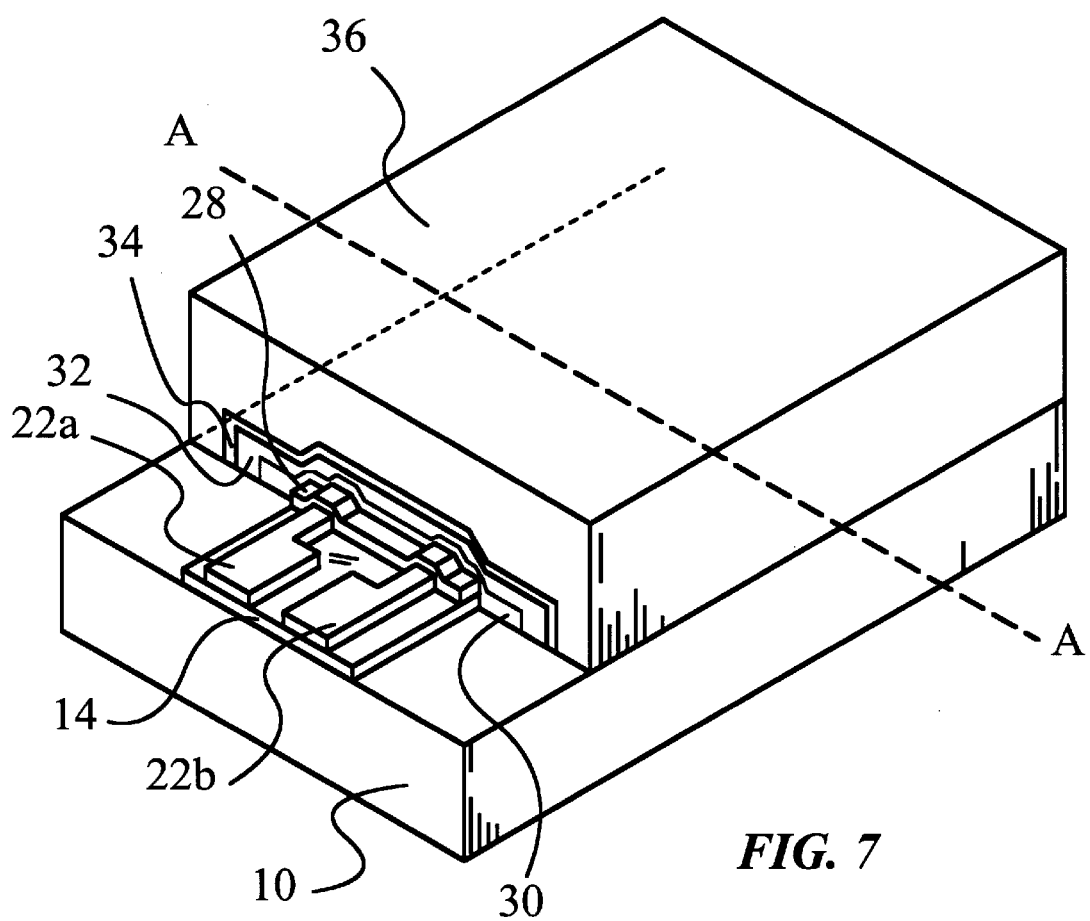
FIG. 7 is an isometric view illustrating the cooled and machined housing containing the electric components.
Figure 8:
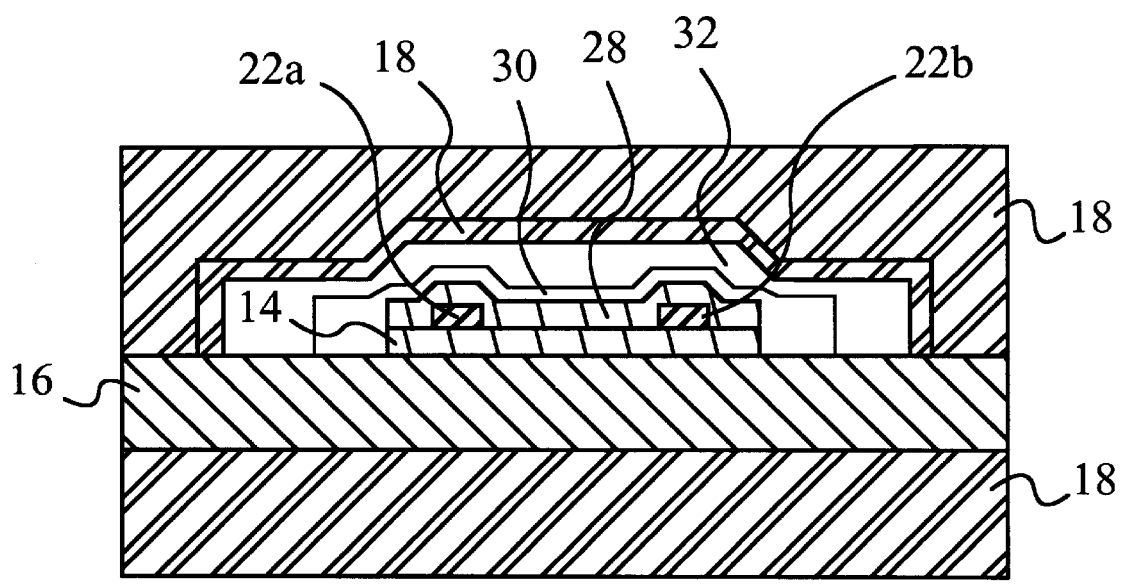
FIG. 8 is a cross sectional view of the housing of FIG. 7.

For purposes of clarity, the cross sectional view of FIG. 8 along line A—A in FIG. 7 specifically identifies the materials of substrate 10, primer layer 34 and cover layer 36 as high-temperature metal 18. Top layer 16 in this case is the preferred INVAR alloy, since it bonds well with the steel which being used as metal 18.

Figure 10:
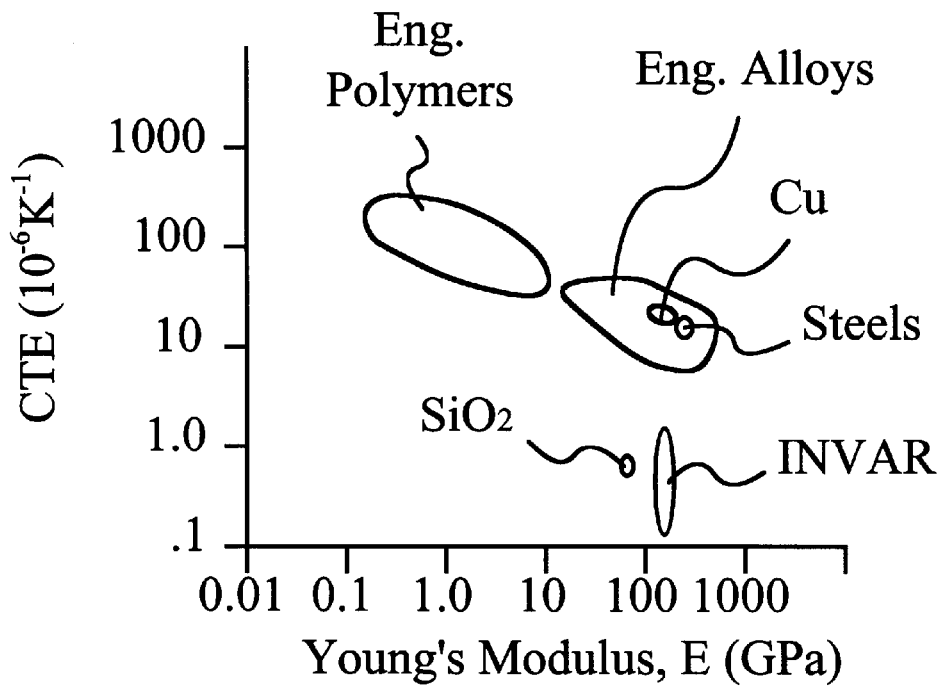
FIG. 10 is a graph of the coefficients of thermal expansion vs. Young's Modulus for selected materials.

It is especially preferred to use $SiO_2$ in electrically insulating layers 14 and 28 when INVAR is used as top layer 16. That is because a first coefficient of thermal expansion $CTE_1$ of INVAR can be matched to a second coefficient of thermal expansion $CTE_2$ of $SiO_2$, as illustrated in the graph of FIG. 10. CTE matching is important during the deposition of cover layer 36 because it mitigates potential delamination problems between substrate 10 and insulating layers 14, 28. Furthermore, CTE matching reduces mechanical stresses experienced by components 22a, 22b during this step.

In the preferred embodiment of the method the embedded electric device is a thermocouple which can be used for collecting data in harsh environments. The process of the invention is simple, cost-effective and suitable for adoption in manufacturing.

In an alternative method, metal 18 can be deposited on top of layer 34 and substrate 10 by the well-known laser deposition process. Similar temperature parameters and melting depth of substrate 10 as during microcasting have to be maintained to ensure that electrical components 22a, 22b are not destroyed and that all previously deposited layers do not delaminate or melt.

Figure 11:
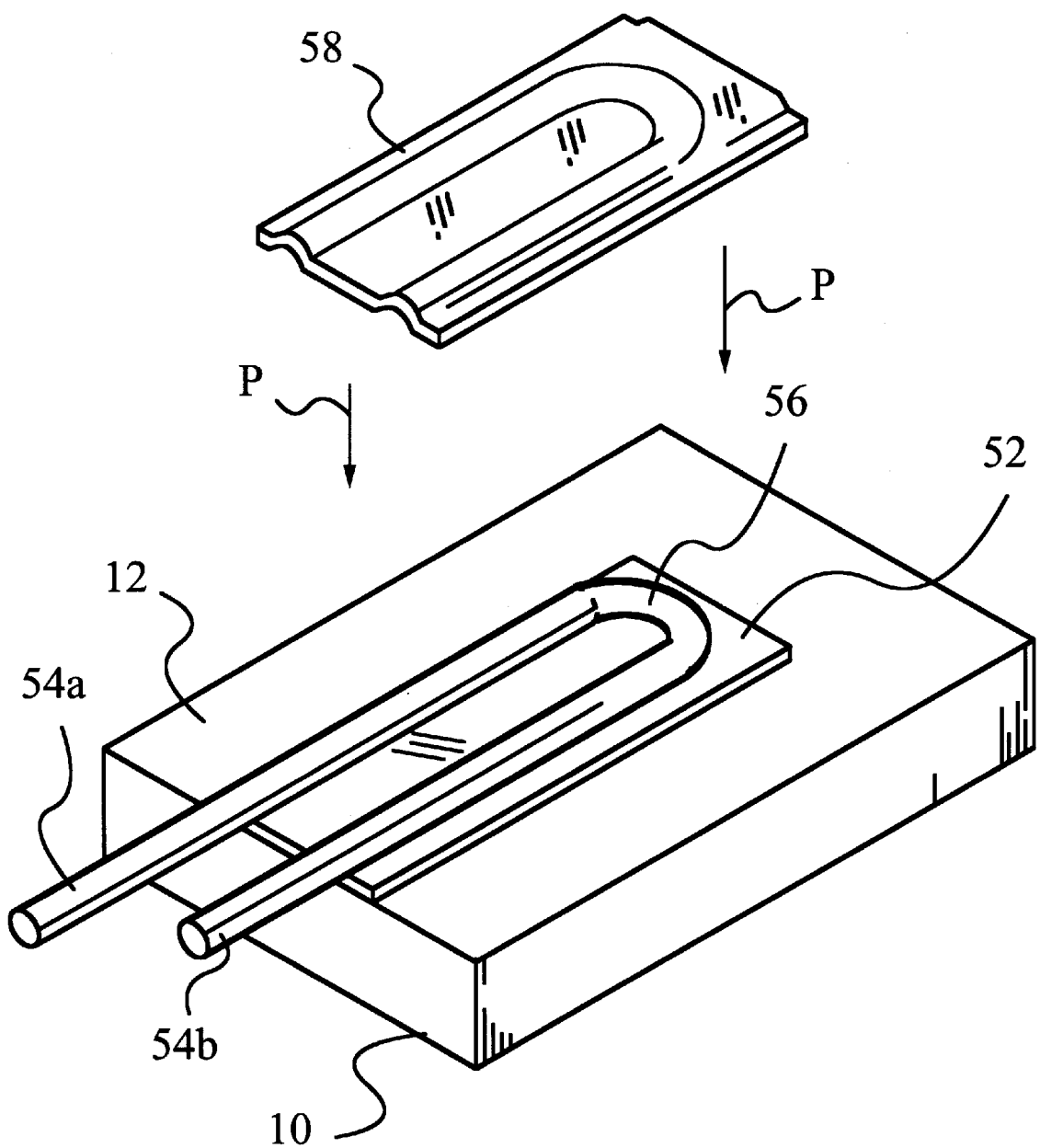
FIG. 11 is an isometric view illustrating the placement of an optical component on a protective layer.

The method of the invention can also be used to embed optical components. FIG. 11 illustrates an optical fiber 56 disposed on substrate 10. The steps of the method are the same, with the exception that electrically insulating layers 14, 28 are replaced by suitable protective layers 52, 58. A person of average skill in the art will know what materials to select.

Optical fiber 56 has an input port 54a for receiving light, and an output port 54b for emitting light. In fact, fiber 56 is a simple optical sensor which measures environmental temperature changes via phase shift of light. Fiber 56 can also be used as a strain gauge, since its transmission properties are affected by bending.

It will be clear to one skilled in the art that the above embodiment may be altered in many ways without departing from the scope of the invention. For example, though the technology is suited for embedding electric and optical components, it can also be used to encase non-electric and non-optic elements requiring protection. In addition, various other approaches to producing molten drops of high-temperature metals can be used as long as the specified temperature and melting depth parameters are kept taking into account what types of elements are being embedded. Accordingly, the scope of the invention should be determined by the following claims and their legal equivalents.

What is claimed is:

1. A method for embedding electric components in a high-temperature metal comprising the following steps:

a) providing a substrate comprising said high-temperature metal;

b) placing said electric components on said substrate;

c) depositing a low thermal conductivity layer on said electric components;

d) depositing a high thermal conductivity layer on said low thermal conductivity layer such that said high low thermal conductivity layer is in contact with said substrate;

e) depositing a primer layer of said high-temperature metal on said high thermal conductivity layer;

f) depositing a cover layer of said high-temperature metal in a molten state on top of said primer layer such that all said layers deposited in steps c through e and said electric components are embedded between said substrate and said cover layer; and g) cooling said cover layer.

2. The method of claim 1, further comprising the steps of:

a) depositing a first electrically insulating layer between said substrate and said electric components; and b) depositing a second electrically insulating layer between said electric components and said low thermal conductivity layer.

3. The method of claim 2, wherein said second electrically insulating layer has a low coefficient of thermal conductivity and said low thermal conductivity layer is absent.

4. The method of claim 1, wherein said cover layer is deposited in drops.

5. The method of claim 4, wherein said drops are set to fall on said primer layer at a predetermined rate.

6. The method of claim 4, wherein said predetermined rate ranges from 1 drop per second to 6 drops per second.

7. The method of claim 1, wherein said cover layer is deposited by a laser deposition technique.

8. The method of claim 1, further comprising the step of depositing an interlayer having a low coefficient of thermal expansion on said low thermal conductivity layer.

9. Electric components embedded in a high-temperature metal by the following steps:

a) providing a substrate comprising said high-temperature metal;

b) placing said electric components on said substrate;

c) depositing a low thermal conductivity layer on said electric components;

d) depositing a high thermal conductivity layer on said low thermal conductivity layer such that said high thermal conductivity layer is in contact with said substrate;

e) depositing a primer layer of said high-temperature metal on said high thermal conductivity layer;

f) depositing a cover layer of said high-temperature metal in a molten state on top of said primer layer such that all said layers deposited in steps c through e and said electric components are embedded between said substrate and said cover layer; and g) cooling said cover layer.

10. The embedded electric components of claim 9 made with the following additional steps:

a) depositing a first electrically insulating layer between said substrate and said electric components; and b) depositing a second electrically insulating layer between said electric components and said low thermal conductivity layer.

11. The embedded electric components claim 10, wherein said second electrically insulating layer has a low coefficient of thermal conductivity and said low thermal conductivity layer is absent.

12. The embedded electric components of claim 10, wherein said substrate further comprises a top layer of an auxiliary material having a first coefficient of thermal expansion, $CTE_1$.

13. The embedded electric components of claim 12, wherein said auxiliary material is INVAR.

14. The embedded electric components of claim 12, wherein at least one of said first electrically insulating layer and said second electrically insulating layer has a second coefficient of thermal expansion, $CTE_2$ which is approximately equal to $CTE_1$.

15. The embedded electric components of claim 9, wherein said electric components comprise a temperature sensor.

16. The embedded electric components of claim 9, wherein said electric components comprise a strain gauge.

17. The embedded electric components of claim 9, wherein said low thermal conductivity layer is a ceramic and said high thermal conductivity layer is copper.

18. The embedded electric components of claim 9, wherein an interlayer having a low coefficient of thermal expansion is deposited on said low thermal conductivity layer.

* * * * *